US007804927B2

(12) United States Patent
Tucholski

(10) Patent No.: US 7,804,927 B2
(45) Date of Patent: Sep. 28, 2010

(54) METHOD FOR LOCKING A SYNTHESISED OUTPUT SIGNAL OF A SYNTHESISED WAVEFORM SYNTHESISER IN A PHASE RELATIONSHIP WITH AN INPUT SIGNAL, AND A DIGITAL WAVEFORM SYNTHESISER FOR PRODUCING A SYNTHESISED OUTPUT SIGNAL IN A PHASE RELATIONSHIP WITH AN INPUT SIGNAL

(75) Inventor: Hans Juergen Tucholski, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 1004 days.

(21) Appl. No.: 11/304,294

(22) Filed: Dec. 15, 2005

(65) Prior Publication Data

US 2006/0186931 A1    Aug. 24, 2006

Related U.S. Application Data

(60) Provisional application No. 60/636,835, filed on Dec. 16, 2004.

(51) Int. Cl.
H03D 3/24 (2006.01)

(52) U.S. Cl. ................ 375/376; 375/375; 375/371; 375/373; 327/105; 327/106; 327/107

(58) Field of Classification Search ................ 375/376, 375/375, 373, 371, 326, 327; 327/105, 106, 327/107, 156
See application file for complete search history.

(56) References Cited

U.S. PATENT DOCUMENTS 3,973,209 A * 8/1976 Nossen et al. ............... 327/105

FOREIGN PATENT DOCUMENTS

GB    2010032    6/1979

OTHER PUBLICATIONS

U.S. Appl. No. 11/280,905, filed Nov. 16, 2005, Hans Juergen Tucholski.
U.S. Appl. No. 11/297,003, filed Dec. 8, 2005, Hans Juergen Tucholski.
Wang, Hong-wei, et al, "High speed digital-to-analog converter with linear interpolator", IEEE Transactions on Consumer Electronics, vol. 46, No. 4, Nov. 2000, pp. 1137-1142.

* cited by examiner

*Primary Examiner*—Phuong Phu
(74) *Attorney, Agent, or Firm*—Goodwin Procter LLP

(57) ABSTRACT

A digital waveform synthesiser (1) is implemented as a single chip integrated circuit on a single chip (2) and comprises a direct digital synthesiser (10) which produces a synthesised output signal waveform on an output terminal (4) which is substantially phase and frequency locked to the phase and frequency of an externally generated input signal applied to an input terminal (5). A comparing circuit (20) compares the period of the synthesised output signal waveform on the output terminal (4) with the period of the input signal, and a control circuit (28) produces progressively altered values of a frequency control digital word which are sequentially applied to an accumulator (11) of the direct digital synthesiser (10) in response to the comparing circuit (20), until the value of the frequency control digital word applied to the accumulator (11) is such as to produce the synthesised output signal waveform to be substantially phase and frequency locked to the phase and frequency input signal applied to the input terminal (5).

49 Claims, 6 Drawing Sheets

| 1 | 2<br>CMP | 3<br>DIV | 4<br>$\frac{CMP}{(1+DIV)}$ | 5<br>\|DF(t-1)\| | 6<br>DF(t) | 7<br>FCD(t) | 8<br>T(t) |
|---|---|---|---|---|---|---|---|
| t=0 | | | | 64 | | 256=Start | 16 |
| t=1 | +1 | 0 | +1 | 64 | +64 | 256 | 16 |
| t=2 | | | | | | 320 | 12.80 |
| t=3 | -1 | 1 | -½ | 64 | -32 | 320 | 12.80 |
| t=4 | | | | | | 288 | 14.22 |
| t=5 | -1 | 1 | -½ | 32 | -16 | 288 | 14.22 |
| t=6 | | | | | | 272 | 15.058 |
| t=7 | +1 | 1 | +½ | 16 | +8 | 272 | 15.058 |
| t=8 | | | | | | 280 | 14.629 |
| t=9 | -1 | 1 | -½ | 8 | -4 | 280 | 14.629 |
| t=10 | | | | | | 276 | 14.841 |
| t=11 | -1 | 1 | -½ | 4 | -2 | 276 | 14.841 |
| t=12 | | | | | | 274 | 14.949 |
| t=13 | -1 | 1 | -½ | 2 | -1 | 274 | 14.949 |
| t=14 | | | | | | 273 | 15.004 |
| t=15 | +1 | 1 | +½ | 1 | 0 | 273 | 15.004 |
| t=16 | | | | | | 273 | 15.004 |
| t=17 | +1 | 1 | +½ | 0 | 0 | 273 | 15.004 |
| | | | | Ideal FCD | | 273.0667 | 15.00 |

Fig. 3

METHOD FOR LOCKING A SYNTHESISED OUTPUT SIGNAL OF A SYNTHESISED WAVEFORM SYNTHESISER IN A PHASE RELATIONSHIP WITH AN INPUT SIGNAL, AND A DIGITAL WAVEFORM SYNTHESISER FOR PRODUCING A SYNTHESISED OUTPUT SIGNAL IN A PHASE RELATIONSHIP WITH AN INPUT SIGNAL

Priority under 35 U.S.C. Section 119(e) is hereby claimed to U.S. Provisional Application No. 60/636,835 filed on Dec. 16, 2004 entitled "A METHOD AND APPARATUS FOR PHASE LOCKING AN OUTPUT SIGNAL OF A DIGITAL WAVEFORM SYNTHESISER TO THE PHASE OF AN INPUT SIGNAL".

FIELD OF THE INVENTION

The present invention relates to a method for locking a synthesised output signal of a digital waveform synthesiser in a phase relationship with an input signal, and in particular, though not limited to a method for phase and frequency locking a synthesised output signal to the phase and frequency of an input signal. The invention also relates to a digital waveform synthesiser for producing a synthesised output signal in a phase relationship with an input signal, and in particular, though not limited to a digital waveform synthesiser for producing a synthesised output signal phase and frequency locked to an input signal. The invention further relates to a method for operating a digital waveform synthesiser and to a digital waveform synthesiser for producing a synthesised output signal of frequency for applying to an external circuit for producing a selectable response from the external circuit.

BACKGROUND TO THE INVENTION

Digital waveform synthesisers are known. Such digital waveform synthesisers comprise a direct digital frequency synthesiser which produces a synthesised output signal of a selectable frequency which is determined by the value of a frequency control digital word applied to a frequency control input of the direct digital synthesiser. By varying the value of the frequency control digital word, the frequency of the synthesised output signal may be varied. Typically, the direct digital synthesiser is clocked by a system clock signal which may be internally generated or externally generated, and comprises a modulo-M accumulator which on respective clock cycles repeatedly accumulates the value of the frequency control digital word for producing digital words which are representative of the phase of the synthesised output signal. A digital signal processing circuit converts the digital words which are indicative of the phase of the synthesised output signal from the accumulator to phase dependent digital words to produce a digital representation of the synthesised output signal. A digital-to-analogue converter converts the digital words which are representative of the synthesised output signal to an analogue representation thereof. Such digital waveform synthesisers are relatively versatile in producing synthesised output signals of selectable waveform and selectable frequency, and in particular for producing synthesised waveforms of selectable frequencies, since the frequency can be readily selected by selecting an appropriate value of the frequency control digital word. However, there is no easy way of operating such digital waveform synthesisers for locking the synthesised output signal produced by such synthesisers in a phase relationship with an externally generated input signal, for example, phase locking the synthesised output signal to the phase, and also the frequency of an externally generated signal.

The present invention is directed towards addressing this problem and providing a digital frequency synthesiser for producing a synthesised output signal in a phase relationship with an externally generated signal, and the invention is also directed towards providing a method for locking a synthesised output signal of a digital waveform synthesiser in a phase relationship with an input signal. The invention is also directed to a method for operating a digital waveform synthesiser and to a digital waveform synthesiser for producing a synthesised output signal waveform of a frequency for applying to an external circuit for producing a selectable response from the external circuit.

SUMMARY OF THE INVENTION

According to the invention there is provided a method for locking a synthesised output signal of a digital waveform synthesiser in a phase relationship with an externally generated input signal, the digital waveform synthesiser comprising a direct digital frequency synthesiser responsive to a frequency control digital word applied thereto for producing the synthesised output signal, the method comprising:

applying an initial value of a frequency control digital word to the direct digital synthesiser, and sequentially applying progressively altered values of the frequency control digital word to the direct digital synthesiser until the synthesised output signal is substantially in the phase relationship with the input signal.

In one embodiment of the invention each subsequent value of the frequency control digital word is a function of the current value thereof.

In another embodiment of the invention the value of the frequency control digital word is increased from the current value thereof in response to the synthesised output signal being in a first state in which the period thereof is greater than 1/H times the period of the input signal, and the frequency control digital word is decreased from the current value thereof in response to the synthesised output signal being in a second state in which the period thereof is less than 1/H times the period of the input signal, where H is a whole number of value from one upwards. In one embodiment of the invention the value of H is selected to be one in order to produce the synthesised output signal to be of frequency substantially similar to the frequency of the input signal.

Advantageously, each subsequent value of the frequency control digital word is derived by summing an amount by which the current value of the frequency control digital word is to be altered with the current value of the frequency control digital word, in response to the synthesised output signal being in the first state, and each subsequent value of the frequency control digital word is derived by subtracting an amount by which the current value of the frequency control digital word is to be altered from the current value of the frequency control digital word, in response to the synthesised output signal being in the second state.

Preferably, each subsequent value of the frequency control digital word after the second value thereof is derived by altering the current value of the frequency control digital word by an amount which is a function of the absolute value of the immediately previous amount by which the value of the frequency control digital word was altered to produce the current value thereof.

In one embodiment of the invention each subsequent value of the frequency control digital word after the second value thereof is produced in response to the synthesised output signal transitioning for the first time from one of the first state and the second state to the other of the first and second states, by altering the current value of the frequency control digital word by an amount which is less than the absolute value of the immediately previous amount by which the value of the frequency control digital word was altered to produce the current value thereof. Preferably, each subsequent value of the frequency control digital word after the second value thereof is produced in response to the synthesised output signal transitioning for the first time from the one of the first state and second states to the other of the first and second states, by altering the current value of the frequency control digital word by an amount which is a proportion of the absolute value of the immediately previous amount by which the value of the frequency control digital word was altered to produce the current value thereof. Advantageously, each subsequent value of the frequency control digital word after the second value thereof is produced in response to the synthesised output signal transitioning for the first time from the one of the first state and second states to the other of the first and second states, by altering the current value of the frequency control digital word by an amount which is approximately half of the absolute value of the immediately previous amount by which the value of the frequency control digital word was altered to produce the current value thereof.

In one embodiment of the invention each subsequent value of the frequency control digital word is produced by altering the current value of the frequency control digital word by an amount of constant value until the synthesised output signal has transitioned for the first time from the one of the first and second states to the other of the first and second states.

In another embodiment of the invention the amount by which the initial value of the frequency control digital word is altered to produce the second value of the frequency control digital word is a function of the absolute value of the initial value of the frequency control digital word. Preferably, the amount by which the initial value of the frequency control digital word is altered to produce the second value of the frequency control digital word does not exceed half the absolute value of the initial value of the frequency control digital word.

In one embodiment of the invention the direct digital synthesiser is reset after each value of the frequency control digital word is applied thereto. Preferably, the direct digital synthesiser is reset in a constant phase relationship with the phase of the input signal. Advantageously, the direct digital synthesiser is reset in phase with the phase of the input signal for producing the synthesised output signal phase locked with the phase of the input signal.

Preferably, each subsequent value of the frequency control digital word is applied to the direct digital synthesiser for a duration corresponding to N periods of the input signal after the current value of the frequency control digital word was applied to the direct digital synthesiser, where N is a whole number from one upwards. Advantageously, the value of N is selected to be equal to two.

Preferably, the direct digital synthesiser is periodically reset after the value of the frequency control digital word which produces the synthesised output signal substantially in the phase relationship with the input signal has been applied to the direct digital synthesiser.

In one embodiment of the invention the state of the synthesised output signal is determined by monitoring a signal indicative of the phase of the synthesised output signal. Advantageously, the signal indicative of the phase of the synthesised output signal is derived from a digital representation of the synthesised output signal.

In one embodiment of the invention the direct digital synthesiser comprises a modulo-M accumulator for producing digital words indicative of the phase of the synthesised output signal in response to each value of the frequency control digital word applied thereto, and the initial value of the frequency control digital word is a function of the value of the modulus M of the accumulator. Preferably, the initial value of the frequency control digital word is less than the value of the modulus M of the accumulator.

In an alternative embodiment of the invention the signal indicative of the phase of the synthesised output signal is derived from an overflow signal from the accumulator.

Ideally, the value of the frequency control digital word which produces the synthesised output signal in the phase relationship with the input signal is substantially equal to D times the product of the value of the modulus M of the accumulator multiplied by the quotient of the value of the period of a clock signal at which the accumulator is clocked divided by the value of the period of the input signal, where D is a whole number from one upwards, subject to the frequency of the synthesised output signal not exceeding half the frequency of the clock signal at which the accumulator is clocked. Preferably, the value of D is selected to be equal to one for producing the synthesised output signal of frequency substantially similar to the frequency of the input signal.

In one embodiment of the invention the synthesised output signal is representative of a sine wave.

In another embodiment of the invention the input signal is a repetitive pulse signal.

Additionally the invention provides a digital waveform synthesiser for producing a synthesised output signal in a phase relationship with an externally generated input signal, the digital waveform synthesiser comprising:

a direct digital frequency synthesiser responsive to a frequency control digital word applied thereto for producing the synthesised output signal, an input terminal for receiving the externally generated input signal, a comparing circuit for comparing a signal indicative of the phase of the synthesised output signal with a signal indicative of the phase of the input signal, and a control circuit for applying an initial value of the frequency control digital word to the direct digital synthesiser, and being responsive to the comparing circuit for subsequently and sequentially applying progressively altered values of the frequency control digital word to the direct digital synthesiser until the synthesised output signal produced by the direct digital synthesiser is substantially in the phase relationship with the input signal.

In one embodiment of the invention the control circuit is adapted for producing each subsequent value of the frequency control digital word as a function of the current value of the frequency control digital word.

In another embodiment of the invention the control circuit is responsive to the comparing circuit determining that the synthesised output signal is in a first state in which the period thereof is greater than 1/H times the period of the input signal for increasing the value of the frequency control digital word from the current value thereof, and the control circuit is responsive to the comparing circuit determining that the synthesised output signal is in a second state in which the period thereof is less than 1/H times the period of the input signal for decreasing the value of the frequency control digital word from the current value thereof, where H is a whole number of value from one upwards. Preferably, the value of H is selected to be equal to one in order to produce the synthesised output signal to be of frequency equal to or substantially equal to the frequency of the input signal.

In one embodiment of the invention the control circuit is responsive to the comparing circuit for determining each subsequent value of the frequency control digital word after the second value thereof by altering the current value of the frequency control digital word by an amount which is a function of the absolute value of the immediately previous amount by which the value of the frequency control digital word was altered to produce the current value thereof.

In another embodiment of the invention the comparing circuit is responsive to the signals indicative of the phases of the synthesised output signal and the input signal for producing a first signal indicative of the state of the synthesised output signal.

In a further embodiment of the invention the control circuit is responsive to the first signal produced by the comparing circuit being indicative of the synthesised output signal being in the first state for summing an amount by which the current value of the frequency control digital word is to be altered with the current value of the frequency control digital word in order to produce the subsequent value of the frequency control digital word, and the control circuit is responsive to the first signal produced by the comparing circuit being indicative of the synthesised output signal being in the second state for subtracting an amount by which the current value of the frequency control digital word is to be altered from the current value of the frequency control digital word in order to produce the subsequent value of the frequency control digital word.

Preferably, the comparing circuit is responsive to the signals indicative of the phases of the synthesised output signal and the input signal for producing a second signal indicative of whether the synthesised output signal has transitioned for the first time from one of the first state and the second state, to the other of the first and second states thereof.

In one embodiment of the invention the control circuit is responsive to the second signal produced by the comparing circuit being indicative of the synthesised output signal having transitioned for the first time from the one of the first and second states to the other thereof for producing each subsequent value of the frequency control digital word after the second value thereof by altering the current value of the frequency control digital word by an amount which is less than the absolute value of the immediately previous amount by which the value of the frequency control digital word was altered to produce the current value thereof.

Preferably, the control circuit is responsive to the second signal produced by the comparing circuit being indicative of the synthesised output signal having transitioned for the first time from the one of the first and second states to the other thereof for producing each subsequent value of the frequency control digital word after the second value thereof by altering the current value of the frequency control digital word by an amount which is proportional to the absolute value of the immediately previous amount by which the value of the frequency control digital word was altered to produce the current value thereof.

Advantageously, the control circuit is responsive to the second signal produced by the comparing circuit being indicative of the synthesised output signal having transitioned for the first time from the one of the first and second states to the other thereof for producing each subsequent value of the frequency control digital word after the second value thereof by altering the current value of the frequency control digital word by an amount which is approximately half the absolute value of the immediately previous amount by which the value of the frequency control digital word was altered to produce the current value thereof.

In one embodiment of the invention the control circuit is responsive to the second signal from the comparing circuit being indicative of the synthesised output signal not having transitioned for the first time from the one of the first and second states to the other thereof for producing each subsequent value of the frequency control digital word by altering the current value of the frequency control digital word by an amount of constant value.

Preferably, the amount by which the initial value of the frequency control digital word is altered by the control circuit to produce the second value thereof is a function of the absolute value of the initial value of the frequency control digital word.

Preferably, the direct digital synthesiser is reset after each value of the frequency control digital word is applied thereto. Advantageously, the direct digital synthesiser is reset in a constant phase relationship with the phase of the input signal. Preferably, the direct digital synthesiser is reset in phase with the phase of the input signal.

In one embodiment of the invention the direct digital synthesiser is reset at intervals corresponding to the duration of N periods of the input signal, where N is a whole number from one upwards. Preferably, the value of N is selected to be equal to two.

Preferably, a reset signal for resetting the direct digital synthesiser is derived from the input signal. Advantageously, the control circuit is responsive to the input signal for applying the respective values of the frequency control digital word to the direct digital synthesiser at the intervals corresponding to the duration of the N periods of the input signal.

In one embodiment of the invention the direct digital synthesiser comprises a modulo-M accumulator for producing digital words representative of the phase of the synthesised output signal, and preferably, the direct digital synthesiser comprises a phase-to-magnitude converter for converting the digital words produced by the accumulator to a digital signal representative of the synthesised output signal.

In one embodiment of the invention the signal indicative of the phase of the synthesised output signal is derived from the digital signal produced by the phase-to-magnitude converter. Alternatively, the signal indicative of the phase of the synthesised output signal is derived from an overflow signal from the accumulator.

Preferably, the initial value of the frequency control digital word is a function of the modulus M of the accumulator.

In one embodiment of the invention the digital waveform synthesiser is implemented as a single chip integrated circuit on a single chip, the direct digital synthesiser, the control circuit and the comparing circuit being implemented as integrated circuits on the single chip.

Preferably, the digital waveform synthesiser comprises a single pin input terminal for receiving the input signal, and a single pin output terminal on which the synthesised output signal is produced.

In one embodiment of the invention first and second communication ports are provided for facilitating writing of the initial value of the frequency control digital word and the initial value of the amount by which the initial value of the frequency control digital word is to be altered, respectively, to the control circuit.

The invention also provides a method for operating a digital waveform synthesiser for producing a synthesised output signal of a frequency for applying to an external circuit to produce a selectable frequency dependent response from the external circuit, wherein the digital waveform synthesiser comprises a direct digital frequency synthesiser responsive to a frequency control digital word applied thereto for producing the synthesised output signal, the method comprising:

applying an initial value of a frequency control digital word to the direct digital synthesiser, and sequentially applying progressively altered values of the frequency control digital word to the direct digital synthesiser until the synthesised output signal is of frequency to produce the selected frequency dependent response from the external circuit.

In one embodiment of the invention each subsequent value of the frequency control digital word is a function of the current value thereof.

In another embodiment of the invention the selectable frequency dependent response from the external circuit is a frequency dependent phase response.

Preferably, a signal indicative of the phase response of the external circuit is compared with a signal indicative of the phase of the synthesised output signal, and each subsequent value of the frequency control digital word is determined in response to the comparison of the signals indicative of the phase response of the external circuit and the phase of the synthesised output signal.

In another embodiment of the invention the selectable frequency dependent response from the external circuit is a frequency dependent magnitude response.

In one embodiment of the invention a signal indicative of the magnitude of the output signal from the external circuit is compared with a reference magnitude, and each subsequent value of the frequency control digital word is determined in response to the comparison of the magnitude of the output signal of the external circuit with the reference magnitude.

The invention further provides a digital waveform synthesiser for producing a synthesised output signal waveform of a frequency for applying to an external circuit to produce a selectable frequency dependent response from the external circuit, the digital waveform synthesiser comprising:

a direct digital frequency synthesiser responsive to a frequency control digital word applied thereto for producing the synthesised output signal to be applied to the external circuit, a feedback terminal for receiving a signal indicative of the frequency dependent response of the external circuit to the synthesised output signal applied thereto, a comparing circuit for comparing a characteristic of the signal indicative of the frequency dependent response of the external circuit with a signal indicative of a corresponding characteristic of the synthesised output signal, and a control circuit for applying an initial value of the frequency control digital word to the direct digital synthesiser, and being responsive to the comparing circuit for subsequently and sequentially applying progressively altered values of the frequency control digital word to the direct digital synthesiser until the synthesised output signal produced by the direct digital synthesiser is of frequency to produce the selected frequency dependent response in the external circuit.

Preferably, the control circuit is adapted for producing each subsequent value of the frequency control digital word as a function of the current value of the frequency control digital word.

In one embodiment of the invention the selectable frequency dependent response to be produced by the external circuit is a frequency dependent phase response.

Preferably, the comparing circuit is adapted for comparing a signal indicative of the phase response of the external circuit with a signal indicative of the phase of the synthesised output signal, and the control circuit is responsive to a signal from the comparing circuit indicative of the comparison for determining each subsequent value of the frequency control digital word.

In a further embodiment of the invention the selectable frequency dependent response to be produced by the external circuit is a frequency dependent magnitude response.

Preferably, the comparing circuit is adapted for comparing a signal indicative of the magnitude of the output signal produced by the external circuit with a reference magnitude, and the control circuit is responsive to a signal from the comparing circuit indicative of the comparison for determining each subsequent value of the frequency control digital word.

ADVANTAGES OF THE INVENTION

The advantages of the digital waveform synthesiser according to the invention are many. The digital waveform synthesiser according to the invention permits a synthesised output signal to be produced with a phase relationship to an externally generated input signal. The synthesised output signal waveform may be substantially completely phase and frequency locked to the input signal, or may be substantially phase locked only to the phase of the input signal, while the frequency of the synthesised output signal waveform may be an harmonic of the frequency of the externally generated input signal. Additionally, the synthesised output signal waveform may be produced out of phase with the phase of the input signal, but in a substantially constant phase relationship to the phase of the input signal, whereby, for example, the synthesised output signal waveform may be produced with a constant phase relationship but out of phase by a constant amount, such as, for example, 90°, 180° or any other desired amount, with the phase of the externally generated input signal.

Additionally, a waveform of any desired shape, for example, sinusoidal, triangular, saw-toothed or any other desired shape, may be produced by the digital waveform synthesiser to be of a desired frequency by merely applying an externally generated input signal of the desired frequency to the digital waveform synthesiser.

Additionally, by virtue of the fact that the synthesised output signal waveform is produced with a phase and frequency relationship to an externally generated input signal, the phase and frequency of the synthesised output signal waveform can be readily altered by merely altering the frequency of the externally generated input signal.

A further advantage of the invention is achieved by providing the digital waveform synthesiser as a single chip integrated circuit on a single chip, since the number of pins required to the digital waveform synthesiser are minimised. Apart from a single pin output terminal and single pin system clock and system reset terminals, as well as normal power supply pins, and the two ports for inputting the initial values of the frequency control digital word and the value of the initial amount by which the frequency control digital word is to be initially altered, the only other pin required is a single pin for receiving the externally generated input signal which permits ready selection of the frequency of the synthesised output signal waveform.

Another advantage of the invention is that by virtue of the fact that the digital waveform synthesiser according to the invention is suitable for producing a sine waveform of similar or substantially similar frequency to a logic square or rectangular waveform, the frequency spectrum of the sine waveform can be filtered considerably more easily than the frequency spectrum of the logic waveform. Thus, the digital waveform synthesiser produces a signal, the frequency spectrum of which is considerably more easily filtered than that of the original logic waveform.

The advantage of providing the digital waveform synthesiser for producing a synthesised output signal waveform of a frequency for applying to an external circuit to produce a selectable response from the external circuit is that the digital waveform synthesiser can readily be used in order to determine the frequency of an input signal to be applied to an external circuit which would produce a selected response. Furthermore, the digital waveform synthesiser can be used to produce a synthesised output signal of the frequency for operating the external circuit for producing the selected response so that the external circuit can readily be operated to produce the selected response.

The invention and its many advantages will be readily apparent from the following description of some preferred embodiments thereof, which are given by way of example only, with reference to the accompanying drawings.

BRIEF DESCRIPTION OF THE DRAWINGS

FIG. 3 is a table illustrating the computation of values of functions computed in the operation of the digital waveform synthesiser of FIG. 1.

DETAILED DESCRIPTION OF PREFERRED EMBODIMENTS

Figure 1:
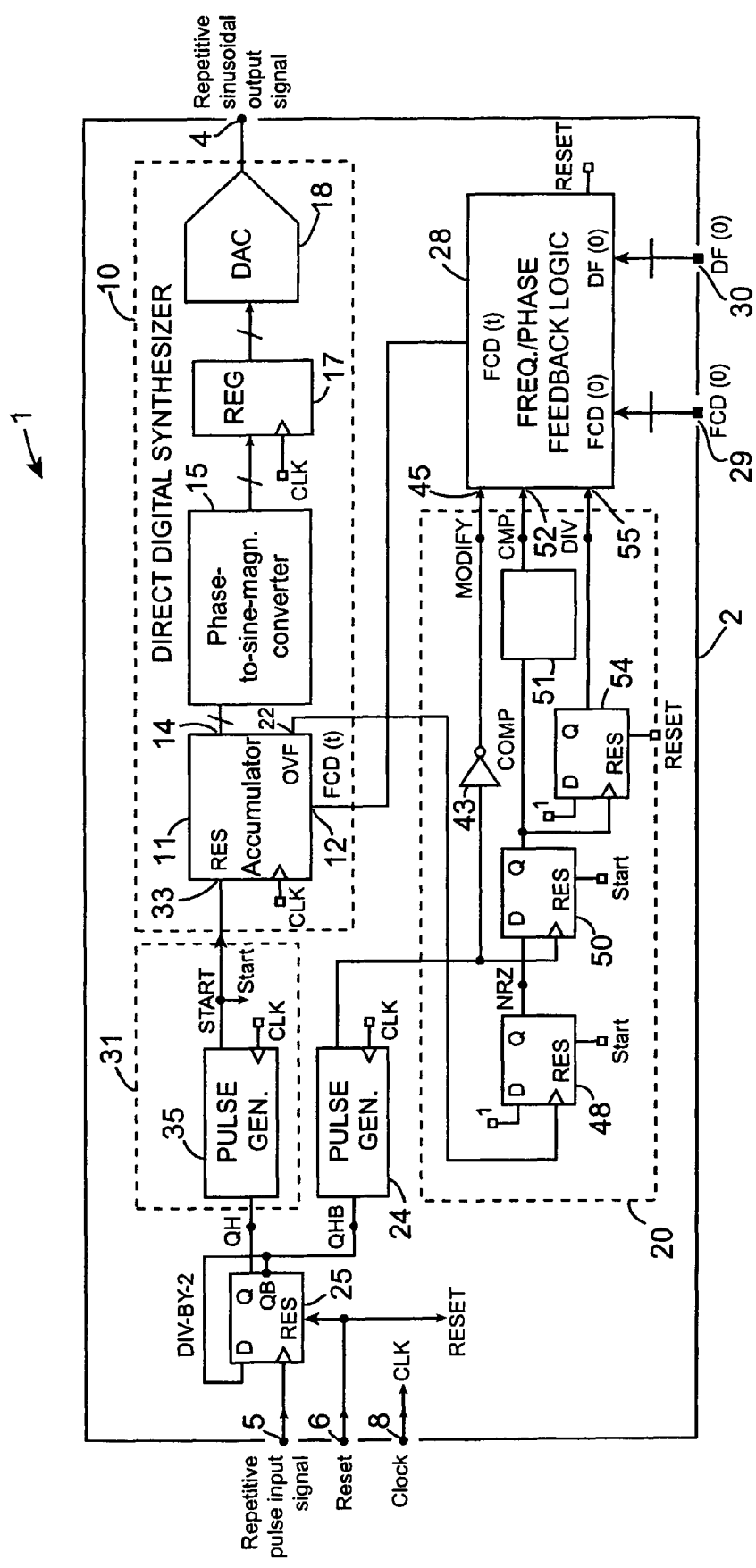
FIG. 1 is a schematic block representation of a digital waveform synthesiser according to the invention for synthesising an output signal in a phase relationship with an externally generated input signal.
Figure 2:
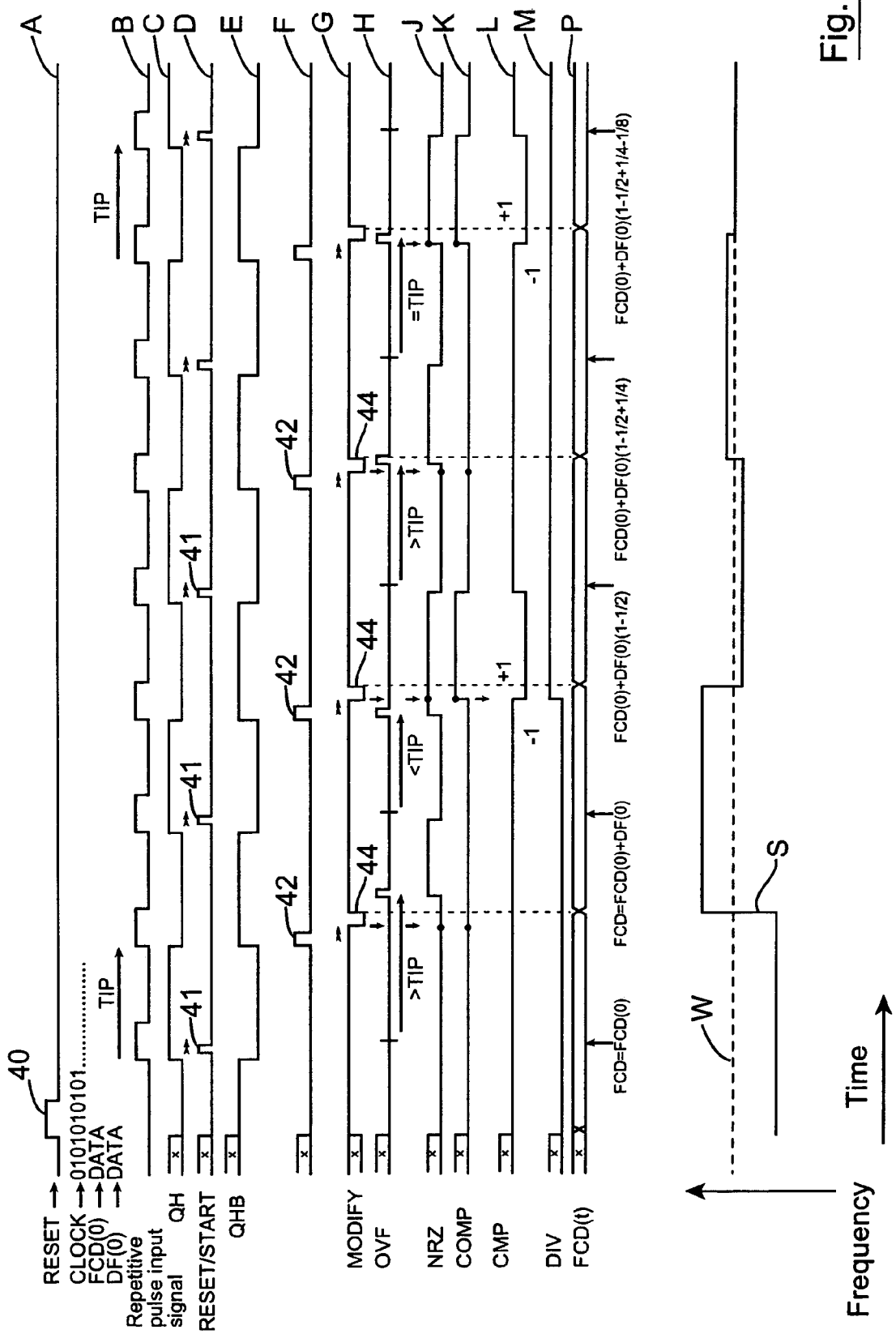
FIG. 2 illustrates representations of signals inputted to, and generated by in the digital waveform synthesiser of FIG. 1.

Referring to the drawings and initially to FIGS. 1 to 3, there is illustrated a digital waveform synthesiser according to the invention, indicated generally by the reference numeral 1, for synthesising an output signal waveform in a phase relationship with an externally generated input signal, which in this case produces the synthesised output signal waveform substantially phase and frequency locked to the phase and frequency of an externally generated input signal. The digital waveform synthesiser 1 is implemented as a single chip integrated circuit on a single chip 2. The synthesised output signal waveform, which in this case is in the form of a sine wave, is produced on a single pin output terminal 4. The externally generated input signal to which the synthesised output signal waveform is to be phase and frequency locked is applied on a single pin input terminal 5. A single pin system reset terminal 6 is provided for receiving an externally generated system reset signal for resetting the digital waveform synthesiser 1. A single pin system clock terminal 8 is provided for receiving an externally generated system clock signal for clocking the digital waveform synthesiser 1. The input signal is typically a repetitive logic signal as will be described below, and the frequency of the input signal is selectable within a range determined by the clock signal applied to the system clock terminal 8. In this embodiment of the invention the frequency of the input signal may be selected to be any value up to half the frequency of the system clock signal applied to the system clock terminal 8.

The digital waveform synthesiser 1 comprises an on-chip direct digital synthesiser 10 which comprises an on-chip numerical controlled oscillator, which in this embodiment of the invention is provided by a modulo-M accumulator 11 which is clocked by the clock signal applied to the system clock terminal 8. The accumulator 11 on respective clock cycles of the clock signal repeatedly accumulates the value of a frequency control digital word applied to a frequency control input 12, and produces digital words on respective clock cycles on an output 14, which are representative of the phase of the synthesised output signal waveform which is produced on the output terminal 4. An on-chip digital signal processing circuit, namely, a phase-to-magnitude converter 15, which converts the digital words produced on the output 14 of the accumulator 11 to phase dependent magnitude digital words which are applied on respective clock cycles to an on-chip DAC register 17, and are converted by an on-chip digital-to-analogue converter DAC 18 to the synthesised output signal waveform which is produced on the output terminal 4.

An on-chip comparing circuit 20 compares a signal indicative of the phase of the synthesised output signal waveform produced on the output terminal 4 with a signal indicative of the phase of the input signal applied to the input terminal 5 for determining when the synthesised output signal waveform is phase and frequency locked to the phase and frequency of the input signal or substantially phase and frequency locked thereto. In this embodiment of the invention the signal which is indicative of the phase of the synthesised output signal waveform is a signal indicative of the period of the synthesised output signal waveform, and is derived from an overflow output 22 of the accumulator 11, and the signal which is indicative of the phase of the input signal is a signal indicative of the period of the input signal, and is derived from an on-chip first pulse generator 24 which is clocked by the clock signal applied to the system clock terminal 8 and an on-chip input flip-flop 25 to which the input signal is applied, and which together produce the signal indicative of the period of the input signal as will be described below. The operation of the comparing circuit 20 will also be described in detail below.

An on-chip control circuit 28 is responsive to the comparing circuit 20 for computing and sequentially applying respective progressively altered values of the frequency control digital word to the frequency control input 12 of the accumulator 11 until the value of the frequency control digital word applied to the frequency control input 12 is of value which produces the synthesised output signal waveform of frequency substantially similar to the frequency of the input signal. A first communication port 29 is provided for applying an initial value of the frequency control digital word to the control circuit 28, and a second communication port 30 is provided for applying an initial value of an amount by which the initial value of the frequency control digital word applied to the control circuit 28 is to be initially altered.

In this embodiment of the invention since the digital waveform synthesiser 1 is adapted for producing the synthesised output signal waveform both phase and frequency locked to the input signal, an on-chip reset signal generating circuit 31 is provided, which in combination with the input flip-flop 25 is responsive to the input signal for producing a RESET/START signal comprising START pulses for applying to a reset input 33 of the accumulator 11 for resetting the accumulator 11 to zero after each value of the frequency control digital word is applied to the frequency control input 12 of the accumulator 11. The altered values of the frequency control digital word are applied to the frequency control input 12 of the accumulator 11 at intervals corresponding to two periods of the input signal. The reset signal generating circuit 31 comprises an on-chip second pulse generator 35 which is clocked by the clock signal applied to the system clock terminal 8. The second pulse generator 35 in response to a signal from the input flip-flop 25 produces the RESET/START signal with the START pulses for applying to the reset input 33 of the accumulator 11 every second period of the input signal for resetting the accumulator 11 to zero once every second period of the input signal.

Before describing the comparing circuit 20 and the operation of the control circuit 28 in further detail, an explanation will be given as to how the values of the frequency control digital word are computed and applied to the frequency control input 12 of the accumulator 11 by the control circuit 28 in accordance with an algorithm that the control circuit 28 is programmed to carry out.

The control circuit 28 is programmed to apply the initial value of the frequency control digital word to the frequency control input 12 of the accumulator 11, and the accumulator 11 is reset by the first START pulse of the RESET/START signal produced by the reset signal generating circuit 31 on a first of a rising edge of the input signal. The initial value of the frequency control digital word, which is applied to the control circuit 28 through the first communication port 29 may be any suitable value, for example, a value equal to one quarter of the value of the modulus M of the accumulator 11. In practice, the initial value of the frequency control digital word will be selected to produce the synthesised output signal waveform to be of frequency less than the frequency of the input signal, and at the end of the first period of the input signal, the comparing circuit 20 determines that the synthesised output signal waveform is in a first state in which the period thereof is greater than the period of the input signal. The control circuit 28 is programmed to alter the value of the frequency control digital word by increasing the value thereof in response to the synthesised output signal waveform being in the first state.

Initially, the initial value of the frequency control digital word is altered by summing the initial value of the amount by which the initial value of the frequency control digital word is to be altered with the initial value of the frequency control digital word. The initial value of the amount by which the frequency control digital word is to be altered is the value which is applied to the control circuit 28 on the second communication port 30, and is a function of the initial value of the frequency control digital word, and for example, may be equal to one quarter of the value of the initial value of the frequency control digital word. On being computed the control circuit 28 applies the altered value of the frequency control digital word to the accumulator 11, and the accumulator 11 is reset to zero by the next START pulse of the RESET/START signal.

The control circuit 28 continues to alter the value of the frequency control digital word applied to the frequency control input 12 of the accumulator 11 every second period of the input signal by summing the initial value of the amount by which the frequency control digital word is to be altered with the current value of the frequency control digital word until the comparing circuit 20 determines that the synthesised output signal waveform has transitioned from the first state to a second state in which the period of the synthesised output signal waveform is less than the period of the input signal.

On the comparing circuit 20 detecting that the synthesised output signal waveform has transitioned for the first time from the first state to the second state, the control circuit 28 is programmed to thereafter alter the value of the frequency control digital word each time the value thereof is being altered by an amount which is equal to half the absolute value of the immediately previous amount by which the value of the frequency control digital word was altered to produce the current value of the frequency control digital word, until the value of the frequency control digital word is of the value which produces the synthesised output signal of frequency similar to or substantially similar to that of the input signal. For durations while the synthesised output signal waveform is in the first state, the control circuit 28 is programmed so that each time the value of the frequency control digital word is to be altered, it is altered by summing the amount by which the value of the frequency control digital word is to be altered to the current value of the frequency control digital word. For durations while the synthesised output signal waveform is in the second state, the control circuit 28 is programmed so that each time the value of the frequency control digital word is to be altered, it is altered by subtracting the amount by which the value of the frequency control digital word is to be altered from the current value of the frequency control digital word. The waveform S of FIG. 2 illustrates an example of a plot of the frequency on the Y-axis against time on the X-axis of the frequency of the synthesised output signal waveform as the value of the frequency control digital word is altered from the initial value thereof to the value which produces the synthesised output signal waveform of frequency similar to or substantially similar to the frequency of the input signal. The frequency of the input signal is represented by the straight line W of FIG. 2.

The value of the frequency control digital word which produces the synthesised output signal waveform of frequency substantially similar to that of the input signal is given by the following equation:

$$FCD = D.M. \cdot \frac{f_{in}}{f_{clk}} \qquad (1)$$

where
FCD is the value of the frequency control digital word,
D is a whole number from one upwards,
M is the value of the modulus of the accumulator,
$f_{in}$ is the frequency of the input signal applied to the input terminal 5, and
$f_{clk}$ is the frequency of the clock signal applied to the system clock terminal 8.

Where it is desired to produce the synthesised output signal waveform of frequency equal to the frequency of the input signal applied to the input terminal 5, the value of D is selected to be one. Where it is desired to produce the synthesised output signal waveform as a harmonic of the frequency of the input signal, the value of D is two or greater, depending on the harmonic of the input signal in which the synthesised output signal waveform is to be produced.

The operation of the control circuit 28 and the comparing circuit 20 for determining the value of each altered value of the frequency control digital word will now be described with reference to FIGS. 1 and 2. The algorithm employed by the control circuit 28 for determining the respective values of the frequency control digital word to be applied to the frequency control input 12 of the accumulator 11 is given by the following equation:

$$FCD(t) = FCD(t-1) + |DF(t-1)| \cdot \frac{CMP(t)}{1 + DIV(t)} \quad (2)$$

where

FCD(t) is the new computed altered value of the frequency control digital word to be applied to the frequency control input 12 of the accumulator 11 at time t, FCD(t−1) is the current value of the frequency control digital word which was applied to the frequency control input 12 of the accumulator 11,

|DF(t−1)| is the absolute value of the immediately previous amount by which the value of the frequency control digital word was altered to produce the current value of the frequency control digital word, namely, the value FCD(t−1), DIV(t) is a value determined by the comparing circuit 20 in response to the synthesised output signal waveform having transitioned for the first time from the first state with the period of the synthesised output signal waveform being greater than the period of the input signal, to the second state with the period of the synthesised output signal waveform being less than the period of the input signal. The value of DIV(t) is zero prior to the synthesised output signal waveform having transitioned from the first to the second state, thereby indicating to the control circuit 28 that the amount by which the value of the frequency control digital word is to be altered from the current value of the frequency control digital word is to be similar to the absolute value of the immediately previous amount by which the value of the frequency control digital word was previously altered. When the synthesised output signal waveform has transitioned from the first state to the second state, the value of DIV(t) is one, indicating that the amount by which the frequency control digital word is to be altered from the current value of the frequency control digital word is to be half the absolute value of the immediately previous amount by which the value of the frequency control digital word was previously altered.

CMP(t) is a value determined by the comparing circuit 20 in response to the state of the synthesised output signal waveform. When the state of the synthesised output signal waveform is in the first state with the period of the synthesised output signal waveform being greater than the period of the input signal, the value of CMP(t) is plus one, thus indicating that the current value of the frequency control digital word is to be increased, and when the synthesised output signal waveform is in the second state, with the period of the synthesised output signal waveform being less than the period of the input signal, the value of CMP(t) is minus one, indicating that the current value of the frequency control digital word is to be reduced.

FIG. 2 represents the logic input signal applied to the input terminal 5, and a system reset signal applied to the system reset terminal 6, and signals produced by components of the digital waveform synthesiser 1, as will now be described.

Signal A of FIG. 2 represents the system reset signal applied to the system reset terminal 6, and on the rising edge of a pulse 40 of the system reset signal A, the digital waveform synthesiser 1 is reset. Signal B represents the input signal applied to the input terminal 5. The input flip-flop 25, which is reset by the system reset signal applied to the system reset terminal 6, is configured to divide the frequency of the input signal on the input terminal 5 by two, and outputs on its Q output a signal QH which is represented by the waveform C, the frequency of which is half that of the input signal. The QH signal from the Q output of the input flip-flop 25 is applied to the second pulse generator 35 of the reset signal generating circuit 31 which is clocked by the system clock signal. The second pulse generator 35 produces the START pulses 41 of the RESET/START signal, which is represented by the signal D of FIG. 2, on each rising edge of the QH signal on the Q output of the input flip-flop 25. The START pulses 41 produced by the pulse generator 35 are applied to the reset input 33 of the accumulator 11 for resetting the accumulator 11 to zero after each new value of the frequency control digital word is applied to the accumulator 11 on every second rising edge of the input signal, in other words, at the beginning of every second period of the input signal.

The input flip-flop 25 produces a QHB signal, represented by the waveform E of FIG. 2, on its Qbar output, which is of frequency equal to half the frequency of that of the input signal, and which is an inverted form of the QH signal outputted on its Q output. The QHB signal from the Qbar output of the input flip-flop 25 is applied to the first pulse generator 24, which is clocked by the system clock, and produces a pulse signal represented by the signal F having pulses 42, which are produced on the rising edges of the QHB signal, and which are each indicative of one period of the input signal after the accumulator 11 has been reset to zero by the previous START pulse 41. The pulse signal F produced by the first pulse generator 24 is applied to an inverter 43 in the comparing circuit 20, which produces a MODIFY pulse signal represented by the signal G, with inverted pulses 44, which are time delayed relative to the corresponding pulses 42 of the pulse signal F generated by the first pulse generator 24. The MODIFY signal produced by the inverter 43 is applied to a first input 45 of the control circuit 28 for a purpose to be described below.

A first flip-flop 48 of the comparing circuit 20 is clocked by the overflow signal OVF of the accumulator 11, which is represented by the signal H of FIG. 2, and on the overflow bit of the overflow signal going high, a single bit of value one is clocked into the first flip-flop 48, which produces a logic one non-return to zero signal NRZ, which is represented by the signal J of FIG. 2, on its Q output. The first flip-flop 48 is reset to zero by the START pulses 41 of the RESET/START signal D produced by the second pulse generator 35, at which stage the Q output of the first flip-flop 48 returns to logic zero.

A second flip-flop 50 of the comparing circuit 20 is clocked by the pulse signal F produced by the first pulse generator 24, the pulses 42 of which are indicative of one period of the input signal from the previous START pulse 41 of the RESET/START signal D. On each pulse 42 of the pulse signal F, the value on the Q output of the first flip-flop 48 is clocked into the second flip-flop 50. The second flip-flop 50 produces on its Q output a COMP signal, which is represented by the signal K of FIG. 2, which indicates whether the synthesised output signal waveform is in the first state, in other words, with its period greater than the period of the input signal, or in the second state with its period less than the period of the input signal. The first and second flip-flops 48 and 50 effectively act as a comparator for comparing the period of the synthesised output signal waveform with the period of the input signal, since the overflow signal OVF of the accumulator 11 is indicative of the period of the synthesised output signal waveform, and the pulse signal of the signal F generated by the first pulse generator 24 is indicative of the period of the input signal from the previous START pulse 41 of the RESET/START signal D. The COMP signal when at logic zero is indicative of the synthesised output signal waveform being in the first state, and the COMP signal when at logic one is indicative of the synthesised output signal waveform being in the second state. The second flip-flop 50 is reset by the START pulses 41 of the RESET/START signal produced by the second pulse generator 35.

A scaling circuit 51 in the comparing circuit 20 converts the COMP signal to a first signal, namely, a CMP signal, which is represented by the waveform L of FIG. 2, and which produces the value CMP(t) of Equation (2) above. The CMP signal is also indicative of whether the synthesised output signal is in the first state or the second state, and is applied to a second input 52 of the control circuit 28, thereby indicating to the control circuit 28 whether the amount by which the current value of the frequency control digital word is to be altered is to be added to or subtracted from the current value of the frequency control digital word. The scaling circuit 51 produces the CMP signal to be of value plus one in response to the value of the COMP signal being at logic zero, and to be of value minus one in response to the COMP signal being at logic one.

A third flip-flop 54 of the comparing circuit 20 is clocked by the COMP signal produced on the Q output of the second flip-flop 50, and on the COMP signal going to logic one, a single bit of value one is clocked into the third flip-flop 54 which produces on its Q output a second signal, namely, a DIV signal represented by the waveform M which produces the value DIV(t) of Equation (2), which is applied to a third input 55 of the control circuit 28. The DIV signal is indicative of the synthesised output signal waveform having transitioned for the first time from the first state to the second state. The third flip-flop 54 is reset only by a reset signal applied to the system reset terminal 6, and thus retains the DIV signal at logic one from the time the synthesised output signal waveform transitions for the first time from the first state to the second state until the digital waveform synthesiser 1 has again been reset by a reset signal on the system reset terminal 6. Accordingly, the DIV signal indicates to the control circuit 28 whether the amount by which the current value of the frequency control digital word is to be altered, is to be the same as the absolute value of the immediately previous amount by which the value of the frequency control digital word was altered or half the absolute value of that amount in order to produce the current value of the frequency control digital word.

The control circuit 28 in response to the falling edge of each MODIFY pulse 44 of the MODIFY signal on its first input 45 reads the current value of the CMP signal on the second input 52 and the current value of the DIV signal on the third input 55. The current values of the CMP and DIV signals provide the control circuit 28 with the values of CMP(t) and DIV(t) from Equation (2). The control circuit 28 computes the next value of the frequency control digital word to be applied to the accumulator 11 on the falling edge of the pulse 44 of the MODIFY signal from the values of the CMP and the DIV signals as well as the current value of the frequency control digital word and the absolute value of the immediately previous amount by which the value of the frequency control digital word was previously altered in accordance with Equation (2). The new computed value of the frequency control digital word is applied by the control circuit 28 to the frequency control input 12 of the accumulator 11 on the rising edge of the same pulse 44 of the MODIFY signal. The accumulator 11 is reset to zero on the next START pulse 41 of the RESET/START signal. On the falling edge of the next pulse 44 of the MODIFY signal, which corresponds approximately to one period of the input signal from the previous START pulse 41, the values of the CMP and DIV signals are again read by the control circuit 28, which provide the results of the comparison of the period of the synthesised output signal waveform resulting from the current value of the frequency control digital word with the period of the input signal. The control circuit 28 then computes the next value of the frequency control digital word, which is applied to the accumulator 11 on the rising edge of the pulse 44 of the MODIFY signal, and so operation of the comparing circuit 20 and the control circuit 28 continues.

Delaying the MODIFY pulses 44 of the MODIFY signal after the respective corresponding START pulses 41 ensures that the values of the CMP and the DIV signals read by the control circuit 28 in response to the corresponding MODIFY pulse 44 are the actual values of the CMP and the DIV signals at the end of the corresponding period of the input signal.

The signal P of FIG. 2 represents the signal values of the frequency control digital words computed by the control circuit 28 and applied to the frequency control input 12 of the accumulator 11 on each START pulse 41 of the RESET/START signal D produced by the second pulse generator 35.

The trajectory S illustrates the progression of the frequency of the synthesised output signal waveform as the value of the frequency control digital word is being altered by the control circuit 28 until the frequency of the synthesised output signal waveform substantially similar to the frequency of the input signal.

Once the synthesised output signal waveform has been substantially phase and frequency locked to the phase and frequency of the input signal, the comparing circuit 20 and the control circuit 28 continue to operate as described above, and depending on the frequency of the input signal, the modulus M of the accumulator 11 and the resolution of the control circuit 28 and the direct digital synthesiser 10, the synthesised output signal waveform may be completely phase and frequency locked to the input signal, or may be substantially phase and frequency locked thereto. If the synthesised output signal waveform is completely phase and frequency locked to the input signal, on each START pulse 41 of the RESET/START signal produced by the second pulse generator 35, the accumulator 11 is merely reset to zero, thus not affecting the synthesised output signal waveform. However, in the event that the synthesised output signal waveform is not completely phase and frequency locked to the input signal, on each START pulse 41 of the RESET/START signal produced by the second pulse generator 35, the accumulator 11 is reset to zero, thereby maintaining the synthesised output signal waveform phase locked to the input signal, and substantially frequency locked thereto.

In use, with the initial value of the frequency control digital word and the initial value of the amount by which the frequency control digital word is to be initially altered written to the control circuit 28 through the first and second communication ports 29 and 30, the digital waveform synthesiser 1 is ready for use. A clock signal to provide the system clock signal for the digital waveform synthesiser 1 is applied to the system clock signal terminal 8 and the input signal of the desired frequency is applied to the input terminal 5. A reset pulse is applied to the system reset terminal 6 for resetting the digital waveform synthesiser 1, which resets the input flip-flop 25 and the third flip-flop 54, as well as the control circuit 28.

Once reset by the reset pulse 40 of the reset signal applied to the system reset terminal 6, the control circuit 28 applies the initial value of the frequency control digital word to the frequency control input 12 of the accumulator 11 and the accumulator 11 is reset to zero by the next START pulse 41 of the RESET/START signal D. The synthesised output signal waveform of a frequency corresponding to the value of the initial value of the frequency control digital word is produced on the output terminal 4. The comparing circuit 20, as described above, compares the period of the synthesised output signal waveform which is produced on the output terminal 4 with the period of the input signal. The control circuit 28 in response to the falling edges of the MODIFY pulses 44 reads the values of the CMP and DIV signals and computes the values of the frequency control digital word to be applied to the frequency control input 12 of the accumulator 11. The computed values of the frequency control digital words are applied by the control circuit 28 to the accumulator 11 on the rising edges of the corresponding MODIFY pulses 44. The accumulator 11 is reset to zero on each START pulse 41 of the RESET/START signal D after each value of the frequency control digital word is applied thereto, and so operation of the digital waveform synthesiser 1 continues until the frequency control digital word is of value, or approaches a value which produces the synthesised output signal waveform to be of frequency similar to or substantially similar to the frequency of the input signal. The values of the respective frequency control digital word are computed based on Equation (2) from the values of the CMP signal and the DIV signal applied to the second and third inputs 52 and 55 of the control circuit 28 by the comparing circuit 20 and from the current value of the frequency control digital word applied to the accumulator 11 and the immediately previous amount by which the frequency control digital word was previously altered.

When the synthesised output signal waveform has been phase and frequency locked or substantially phase and frequency locked to the phase and frequency of the input signal, the digital waveform synthesiser 1 produces the synthesised output signal waveform phase and frequency locked or substantially phase and frequency locked to the input signal until the digital waveform synthesiser 1 is reset by a reset pulse of a reset signal applied to the system reset terminal 6, or until the frequency of the input signal applied to the input terminal has been altered. At which stage when the frequency of the input signal is altered and a reset pulse is applied to the system reset terminal 6, the control circuit 28 again applies the initial value of the frequency control digital word to the accumulator 11, and the control circuit 28 in response to the comparing circuit 20 applies progressively altered values of the frequency control digital word to the accumulator until the synthesised output signal waveform is phase and frequency locked or substantially phase and frequency locked to the phase and frequency of the new input signal.

In order to further illustrate the operation of the digital waveform synthesiser 1 of FIG. 1 in producing the synthesised output signal waveform on the output terminal 4 phase and frequency locked or substantially phase and frequency locked to the phase and frequency of the input signal, reference is now made to FIG. 3. FIG. 3 illustrates a table which sets out the decimal values of the frequency control digital words computed by the control circuit 28 based on Equation (2) above, as the values of the frequency control digital word are being progressively altered in order to produce the frequency control digital word which produces the synthesised output signal of frequency similar to that of the input signal. In this example the accumulator 11 is a twelve bit accumulator having a modulus M of decimal value 4096. The period of the input signal is 15 times the period of the clock signal, and thus from Equation (1) with D=1, the ideal value of the frequency control digital word is decimal value 273+0.0667 in order that the synthesised output signal waveform is of frequency similar to that of the input signal. In this example the initial value of the frequency control digital word at time t equal to zero, namely, FCD(0) is selected as being decimal value 256, and the initial amount by which the frequency control digital word is to be initially altered, namely, DF(0) is selected in this example to be one quarter of the initial value of the frequency control digital word, namely, decimal value 64.

In the table of FIG. 3, column 1 sets out the time, which is indicated by the periods of the input signal from the first rising edge of the input signal after the digital waveform synthesiser 1 has been reset by a reset pulse 40 of a system reset signal applied to the system reset terminal 6. The first rising edge of the input signal, which is the beginning of the first period of the input signal is represented by time t=0, the second rising edge of the input signal, which is the beginning of the second period of the input signal is represented by time t=1, and so on up to the eighteenth rising edge of the input signal, which is represented by time t=17. Column 2 sets out the values of the CMP signal at the end of the first period of the input signal, which corresponds with time t=1, and at the end of the third, fifth and at the end of the remaining odd periods up to the end of the seventeenth period of the input signal. These are the values of the CMP signal which are applied to the second input 52 of the control circuit 28, and are read by the control circuit 28 on the falling edges of the corresponding MODIFY pulses 44 of the MODIFY signal applied to the first input 45 of the control circuit 28. The third column of Table 3 sets out the values of the DIV signal at the end of the first period of the input signal, and at the end of the third, fifth and each of the odd periods of the input signal up to the end of the seventeenth period of the input signal. These are the values of the DIV signal which are applied to the third input 55 of the control circuit 28, and which are read by the control circuit 28 on the falling edges of the corresponding MODIFY pulses 44 of the MODIFY signal. Column 4 of the table sets out the value of the function $$\frac{CMP}{(1+DIV)}$$

which is computed by the control circuit 28 in response to the corresponding values of the CMP and DIV signals read by the control circuit 28 at the corresponding time t.

Column 5 of the table sets out the absolute value of the immediately previous amount by which the value of the frequency control digital word was previously altered in order to produce the current value which was last applied by the control circuit 28 to the accumulator 11. In other words, column 5 sets out the absolute values of the amount at time (t−1), namely, DF(t−1). As discussed above, the initial value of the amount by which the initial value of the frequency control digital word is to be altered is decimal 64, and this was entered to the control circuit 28 prior to time t=0 through the second communication port 30. Column 6 of the table sets out the computed value of the amount by which the current value of the frequency control digital word is to be altered to produce the next value of the frequency control digital word to be applied to the accumulator 11.

Column 7 of the table sets out the values of the frequency control digital word applied to the accumulator 11 when the accumulator is reset by the START pulses 41 at the beginning of the first, third, and the other odd periods up to the odd period commencing at t=16. The initial value of the frequency control digital word, which is decimal 256 is the value being applied to the accumulator 11 at time t=0, and is set out in column 7 against time t=0. However, the value of decimal 256 of the frequency control digital word is also included in column 7 set out against time t=1, since the next value the frequency control digital word is not applied to the accumulator 11 until the rising edge of the MODIFY pulse 44, which is after time t=1. The remaining values of the frequency control digital word applied to the accumulator by the control circuit 28 are correspondingly set out in column 7 of the table.

The periods of the synthesised output signal waveform resulting from the corresponding values of the frequency control digital word at the times t are set out in column 8. In this particular example the period of the input signal is fifteen clock cycles of the clock signal applied to the system clock system terminal 8, and thus, the ideal period of the synthesised output signal waveform should be produced with a period of fifteen clock cycles, or a period substantially similar to fifteen clock cycles. In this particular example at time t=0 the initial value of the frequency control digital word of decimal 256 applied to the accumulator 11 when the accumulator 11 is reset at time t=0 by the START pulse 41 produces the synthesised output signal waveform to have a period of sixteen clock cycles, which is greater than the period of the input signal. Thus, at time t=1 the value of the CMP signal is +1, and the value of the DIV signal is zero, since the synthesised output signal waveform has not yet for the first time transitioned from the first state to the second state. Accordingly, the value of the function $$\frac{CMP}{(1+DIV)}$$

is equal to +1, and since the initial amount by which the frequency control digital word is to be initially altered is of absolute value decimal 64, the amount by which the current value of the frequency control digital word is to be altered to produce the next value of the frequency control digital word to be applied to the accumulator 11 is +64. Thus, the control circuit 28 computes the next value of the frequency control digital word to be of decimal value 320. This results in the synthesised output signal waveform being produced with a period of 12.80 time units, which is less than the period of fifteen time units of the input signal. Thus, at time t=3 the CMP signal is of value −1, and the value of the DIV signal is 1, since the synthesised output signal waveform transitioned from the first state to the second state at time t=3, and from here on, the value of the DIV signal remains at logic one, and will do so until the waveform synthesiser 1 is reset by a reset pulse on the system reset terminal 6. Thus, at time t=3 the value of the function $$\frac{CMP}{(1+DIV)}$$

is computed by the control circuit 28 to be equal to −½. Since the absolute value of the immediately previous amount by which the frequency control digital word was altered at time t=2 was decimal 64, the amount by which the frequency control digital word is to be altered to produce the next value of the frequency control digital word to be applied to the accumulator 11 is equal to decimal −32. Thus, the control circuit 28 subtracts the value of decimal 32 from the current value of the frequency control digital word of decimal 320 to produce the new value of the frequency control digital word of decimal 288 which is to be applied to the accumulator 11, so that at time t=4 the value of the frequency control digital word applied to the accumulator 11 is decimal 288, and so on until time t=14 when the computed value of the frequency control digital word of decimal 273 is applied to the accumulator 11 when the accumulator 11 is reset by the START pulse 41 at time t=14. The decimal value of the frequency control digital word of 273 produces the synthesised output signal waveform to be of period 15.004 clock cycles, which is approximately equal to the period of fifteen clock cycles of the input signal. At time t=15 the control circuit 28 computes the value DF(t) of the amount by which the current value of the frequency control digital word is to be altered to be equal to zero. This is as a result of the fact that the absolute value of the previous amount by which the value of the frequency control digital word was altered is one, and the resolution of the control circuit 28 is such as to produce the value of the amount by which the current value of the frequency control digital word is to be altered to be equal to zero. Thus, from here on, the control circuit 28 computes the next value of the frequency control digital word to be the same as the current value of the frequency control digital word. Accordingly, the control circuit 28 maintains the value of the frequency control digital word applied to the accumulator 11 at decimal 273, and the accumulator 11 is reset to zero by the START pulse 41 of the RESET/START signal every second period of the input signal, thereby maintaining the synthesised output signal substantially phase and frequency locked to the phase and frequency of the input signal.

Figure 4:
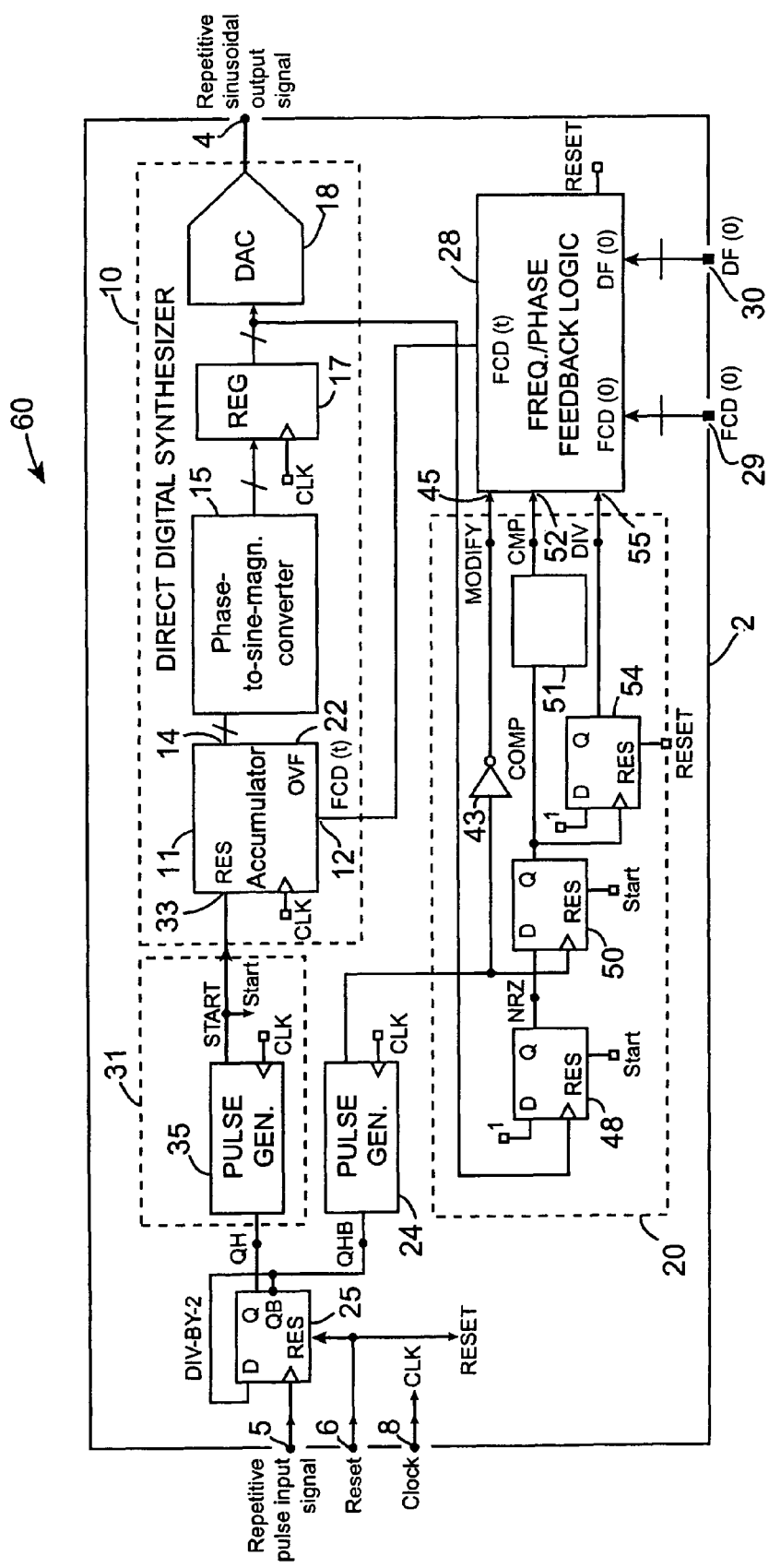
FIG. 4 is a schematic block representation of a digital waveform synthesiser according to another embodiment of the invention for synthesising an output signal in a phase relationship with an externally generated input signal.

Referring now to FIG. 4, there is illustrated a digital waveform synthesiser according to another embodiment of the invention, which is indicated generally by the reference numeral 60. The digital waveform synthesiser 60 is substantially similar to the digital waveform synthesiser 1 and similar components are identified by the same reference numerals. The main difference between the digital waveform synthesiser 60 and the digital waveform synthesiser 1 described with reference to FIGS. 1 and 2 is that the signal indicative of the phase of the synthesised output signal waveform, instead of being derived from the overflow output of the accumulator 11, in this embodiment of the invention is derived from the digital signal which is representative of the phase dependent magnitude of the synthesised output signal waveform produced by the phase-to-magnitude converter 15. In this embodiment of the invention the signal is derived from the most significant bit of the digital signal, which is the sign bit of the digital representation of the synthesised output signal waveform, and is derived from the DAC register 17. Thus, the first flip-flop 48 of the comparing circuit 20 is clocked by the sign bit of the digital representation of the synthesised output signal waveform derived from the DAC register 17. Otherwise, the digital waveform synthesiser 60 is similar to the digital waveform synthesiser 1, and its operation is likewise similar, with the exception that each time the sign bit of the digital signal representative of the synthesised output signal waveform goes positive, the single bit 1 is clocked into the first flip-flop 48 of the comparing circuit 20.

Figure 5:
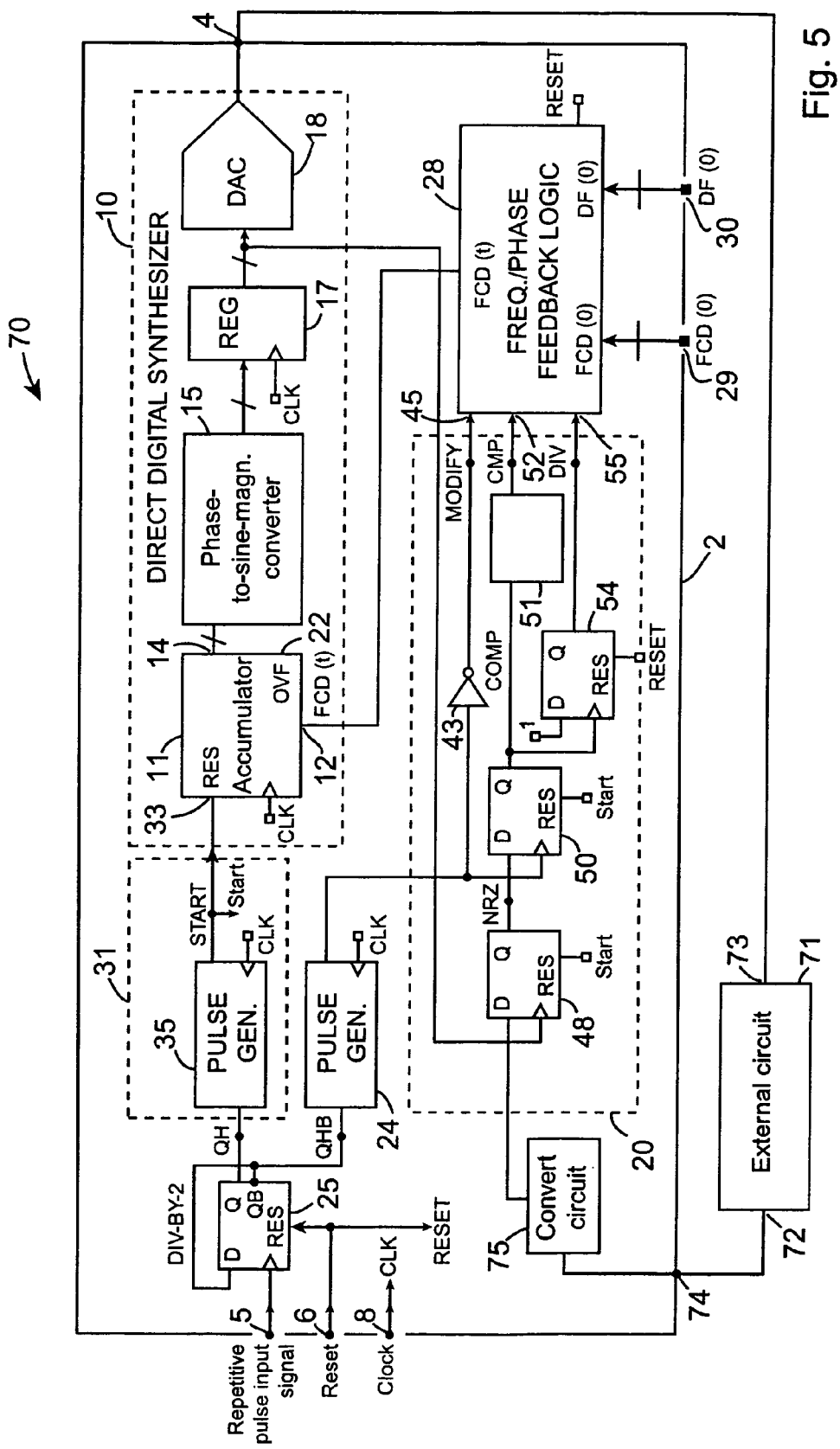
FIG. 5 is a schematic block representation of a digital waveform synthesiser also according to the invention for producing a synthesised output signal waveform of a frequency for applying to an external circuit to produce a selectable response in the external circuit.
Figure 6:
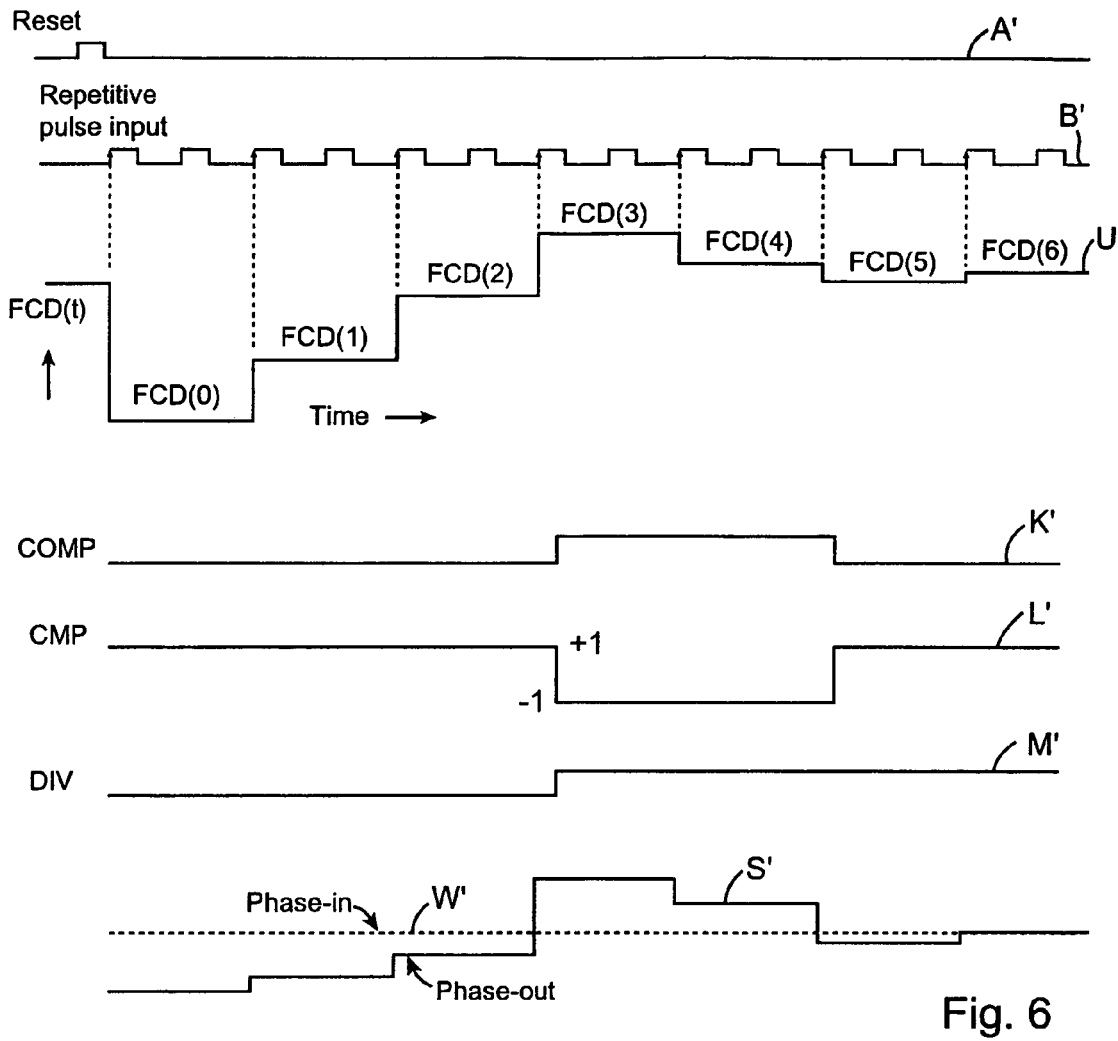
FIG. 6 illustrates representations of signals inputted to and produced by the digital waveform synthesiser of FIG. 5.
Figure 7:
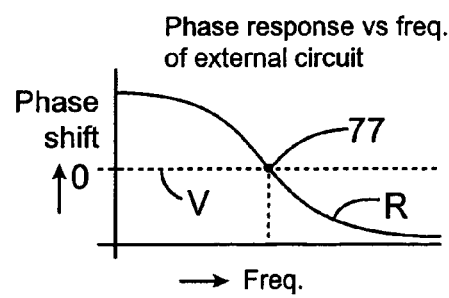
FIG. 7 illustrates a waveform representative of a response of the external circuit to the synthesised output signal waveform produced by the digital waveform synthesiser of FIG. 5.

Referring now to FIGS. 5 to 7, there is illustrated a digital waveform synthesiser also according to the invention, indicated generally by the reference numeral 70. In this embodiment of the invention the digital waveform synthesiser 70 is configured for producing a synthesised output signal waveform of frequency to produce a selectable response from an external circuit 71. The digital waveform synthesiser 70 is substantially similar to the digital waveform synthesiser 1 described with reference to FIGS. 1 to 3, and similar components are identified by the same reference numerals. In this case the external circuit 71 is a circuit which produces an output signal on an output 72, the phase of which is responsive to the frequency of an input signal applied to an input 73 thereof. Such an external circuit could, for example, be a tuned circuit. In this particular example the digital waveform synthesiser 70 is operated to produce a synthesised output signal, the frequency of which is such that when applied to the input 73 of the external circuit 71 an output signal is produced on the output 72 of the external circuit 71 which is in phase with the synthesised output signal.

The synthesised output signal produced on the output terminal 4 of the digital waveform synthesiser 70 is applied to the input 73 of the external circuit 71, and a signal representative of the phase of the output signal produced by the external circuit on the output 72 is fed back to a single pin feedback terminal 74 of the digital waveform synthesiser 70. The control circuit 28 of the digital waveform synthesiser 70 is responsive to the signal applied to the feedback terminal 74 for progressively altering the value of the frequency control digital word applied to the accumulator 11 until the phase of the output signal of the external circuit 71 is in phase with the phase of the synthesised output signal on the output terminal 4.

The externally generated input signal, which is a repetitive logic signal of constant frequency is applied to the input terminal 5 of the digital waveform synthesiser 70 in similar fashion as the input signal is applied to the input terminal 5 of the digital waveform synthesiser 1.

An on-chip converting circuit 75 converts the feedback signal from the external circuit 71 to a logic signal, which is indicative of the phase of the output signal on the output 72 of the external circuit 71, and the logic signal is applied to the D input of the first flip-flop 48 of the comparing circuit 20. A signal indicative of the phase of the synthesised output signal on the output terminal 4 is derived from the digital signal produced by the phase-to-magnitude converter 15 which is indicative of the phase of the synthesised output signal, and the signal is derived from the DAC register 17, in similar fashion as in the case of the digital waveform synthesiser 60 of FIG. 4. The value of the logic signal produced by the converting circuit 75 is clocked into the first flip-flop 48 by the signal derived from the DAC register 17. Thereafter the comparing circuit 20 of the digital waveform 70 is similar to the comparing circuit 20 of the digital waveform circuit 1 described with reference to FIGS. 1 to 3.

In use, the initial value of the frequency control digital word is written to the control circuit 28 through the first communication port 29, and the initial value of the amount by which the initial value of the frequency control digital word is to be altered is written to the control circuit 28 through the second communication port 30. The externally generated input signal is applied to the input terminal 5, and a reset pulse similar to the reset pulse 40 of a reset signal is applied to the system reset terminal 6, thus resetting the accumulator 11 and the third flip-flop 54 of the control circuit 28.

The initial value of the frequency control digital word is applied to the frequency control input 12 of the accumulator 11, and the synthesised output signal is produced by the direct digital synthesiser 10 on the output 4, which is applied to the input 73 of the external circuit 71. The feedback signal from the output 72 of the external circuit 71 is converted by the converting circuit 75 to the logic control signal indicative of the phase of the output signal of the external circuit 71, and the value of the logic signal from the converting circuit is clocked into the first flip-flop 48 by the signal derived from the DAC register 17 which is indicative of the phase of the synthesised output signal waveform produced on the output terminal 4. Thus, the first and the second flip-flops 48 and 50 of the comparing circuit 20 act as a comparator for comparing the phase of the output signal from the external circuit 71 with the phase of the synthesised output signal on the output terminal 4.

Signals corresponding to the signals produced by the digital waveform synthesiser 1 of FIG. 1, which are illustrated in FIG. 2, are produced by the digital waveform synthesiser 70, and for convenience only the system reset signal, the input signal and the signals COMP, CMP and DIV are illustrated in FIG. 6, and identified as the signals A', B', K', L' and M', respectively. The trajectory U in FIG. 6 represents the values of the frequency control digital word which are computed and applied by the control circuit 28 to the frequency control input 12 of the accumulator 11. The waveform S' represents the phase difference between the phase of the output signal on the output 72 of the external circuit 71 and the phase of the synthesised output signal on the output terminal 4 as the value of the frequency control digital word is altered. The straight line W represents the normalised phase of the synthesised output signal.

The control circuit 28 progressively alters the values of the frequency control digital word which are applied to the frequency control input 12 of the accumulator 11 in response to the MODIFY, CMP and DIV signals applied to the first, second and third inputs 45, 52 and 55, respectively, of the control circuit 28 in similar fashion as already described with reference to the digital waveform synthesiser 1 described with reference to FIGS. 1 to 3 until the output signal produced on the output 72 of the external circuit 71 is in phase or substantially in phase with the synthesised output signal on the output terminal 4 of the digital waveform synthesiser 70. Once the output signal on the output 72 of the external circuit 71 is in phase with the synthesised output signal on the output terminal 4 of the digital waveform synthesiser 70, the control circuit 28 maintains the value of the frequency control digital word constant until the digital waveform synthesiser 70 is reset by a reset pulse of a reset signal applied to the system reset terminal 6.

Otherwise, the digital waveform synthesiser 70 and its operation is similar to that of the digital waveform synthesiser 1 described with reference to FIGS. 1 to 3.

Referring now to FIG. 7, a plot of the phase shift of the output signal on the output 72 of the external circuit 71 against frequency of the input signal applied on the input 73 of the external circuit 71 is illustrated. Phase shift is plotted on the Y-axis, with frequency plotted on the X-axis. The waveform R of FIG. 7 illustrates how the phase of the output signal on the output 72 of the external circuit 71 shifts relative to the phase of the input signal on the input 73 of the external circuit 71 as the frequency of the input signal on the input terminal 73 is increased. The straight line V represents a phase shift of zero, and the point 77 on the waveform R where the straight line V cuts the waveform R indicates the frequency of the input signal on the input 73 which produces the output signal on the output 72 of the external circuit 71 in phase with the input signal.

While the digital waveform synthesiser 70 of FIG. 5 has been described for producing a synthesised output signal for applying to an external circuit in order to produce an output signal of the external circuit in phase with the input signal, it will be readily apparent to those skilled in the art that the digital waveform synthesiser of FIG. 5 may be used for producing a synthesised output signal for applying to any other type of external circuit for producing any other type of frequency dependent selectable response, besides a phase response, for example, the digital waveform synthesiser of FIG. 5 may be used for producing a synthesised output signal for applying to an external circuit for producing a selectable frequency dependent magnitude response from the external circuit. In which case, the converting circuit of the digital waveform synthesiser of FIG. 5 would be adapted for comparing the magnitude of the output signal of the external circuit with a reference magnitude and producing a logic signal which would be applied to the D input of the first flip-flop 48 of the comparing circuit 20, and the first flip-flop 48 would be clocked periodically by an appropriate signal derived from the direct digital synthesiser, so that the comparing circuit 20 would produce the MODIFY, CMP and DIV signals to the control circuit 28.

While the digital waveform synthesisers have been described as comprising input ports for facilitating writing the initial value of the frequency control digital word and the initial amount by which the frequency control digital word is to be initially altered to the control circuit, it is envisaged in certain cases that the initial value of the frequency control digital word and the initial value and the initial amount by which the initial value of the frequency control digital word is to be altered may be stored permanently in the control circuit, or alternatively, the control circuit may be programmed to compute the initial value of the frequency control digital word and the initial amount by which the frequency control digital word is to be initially altered.

While the digital waveform synthesisers described with reference to FIGS. 1 to 4 have been described as producing a synthesised output signal waveform which is phase and frequency, or substantially phase and frequency locked to the phase and frequency of the input signal, it is envisaged in certain cases, that while the synthesised output signal waveform may be produced to be phase locked or substantially phase locked to the phase of the input signal, the synthesised output signal waveform may be produced as an harmonic of the frequency of the input signal. This would merely require appropriately altering the comparing circuit. Indeed, it is also envisaged that while the synthesised output signal waveform has been described as being phase locked to the phase of the input signal, it is envisaged that the synthesised output signal waveform may be locked to the input signal in another phase relationship other than being directly in phase with the phase of the input signal. For example, the synthesised output signal waveform could be produced to be out of phase by, for example, 90°, 180°, or by any other amount with the phase of the input signal, but nonetheless in a constant phase relationship with the input signal. This would require deriving an appropriate signal from the direct digital synthesiser.

It will be appreciated that the input signal to the digital waveform synthesisers according to the invention may be any suitable repetitive signal, and in general, will be a logic signal. Indeed, in certain cases, it is envisaged that the repetitive logic input signal to the digital waveform synthesiser of FIG. 5, when used to produce a selectable frequency dependent response from an external circuit, may be produced by an on-chip signal generator.

It will of course be appreciated that the synthesised output signal waveform may be any other desired waveform, besides a sinusoidal waveform, for example, the output signal may be a triangular waveform, a saw-tooth waveform, or any other desired waveform, and may even be a logic signal. It is also envisaged that the synthesised output signal waveform may be provided in digital or analogue form.

While the initial value of the frequency control digital word has been described as being selected to produce the synthesised output signal waveform to have a period greater than the period of the input signal, it is envisaged in certain cases, that the initial value of the frequency control digital word may be selected to produce the synthesised output signal waveform to have a period less than the period of the input signal. In which case, the value of the frequency control digital word would be reduced by constant amounts until the synthesised output signal waveform transitioned for the first time from the second state to the first state, and thereafter the amounts by which the value of the frequency control digital word would be altered would be half the absolute value of the immediately previous amounts by which the value of the frequency control digital word was last altered.

While it is advantageous that the amounts by which the values of the frequency control digital word are altered after the synthesised output signal waveform has transitioned from one of the first and second states to the other of the first and second states should be half the absolute value of the amounts by which the values of the frequency control digital word had last been altered, it will be appreciated that the amounts by which the values of the frequency control digital word are to be altered need only be less than the absolute value of the previous amount by which the value of the frequency control digital word was previously altered.

While specific relationships between the initial value of the frequency control digital word and the modulus M of the accumulator and the initial amount by which the initial value of the frequency control digital word is to be initially altered have been described, other suitable relationships between the respective values may be used.

While a specific implementation of the comparing circuit has been described in the digital waveform synthesisers described with reference to FIGS. 1, 4 and 5, any other suitable implementation of a comparing circuit may be used.

The invention claimed is:

1. A method for locking a synthesised output signal of a digital waveform synthesiser in a phase relationship with an externally generated input signal, the digital waveform synthesiser comprising a direct digital frequency synthesiser responsive to a frequency control digital word applied thereto for producing the synthesised output signal, the method comprising:

applying an initial value of a frequency control digital word to the direct digital synthesiser, and sequentially applying progressively altered values of the frequency control digital word to the direct digital synthesiser until the synthesised output signal is substantially in the phase relationship with the input signal, wherein each subsequent value of the frequency control digital word is derived from the current value of the frequency control digital word by altering the current value of the frequency control digital word by an amount, the value of which is constant until the synthesised output signal has transitioned from one of a first state with the period of the synthesised output signal being greater than 1/H times the period of the input signal and a second state with the period of the synthesised output signal being less than 1/H times the period of the input signal to the other of the first and second states, where H is a whole number, and on the synthesised output signal having transitioned from the one of the first and second states to the other of the first and second states, each subsequent value of the frequency control digital word is derived from the current value of the frequency control digital word by altering the current value of the frequency control digital word by an amount the value of which is less than the absolute value of the immediately previous amount by which the value of the frequency control digital word was altered.

2. A method as claimed in claim 1 in which the value of the frequency control digital word is increased from the current value thereof in response to the synthesised output signal being in the first state, and the frequency control digital word is decreased from the current value thereof in response to the synthesised output signal being in the second state.

3. A method as claimed in claim 1 in which the value of H is selected to be one.

4. A method as claimed in claim 1 in which the amount by which the current value of the frequency control digital word is to be altered is summed with the current value of the frequency control digital word, in response to the synthesised output signal being in the first state.

5. A method as claimed in claim 1 in which the amount by which the current value of the frequency control digital word is to be altered is subtracted from the current value of the frequency control digital word in response to the synthesised output signal being in the second state.

6. A method as claimed in claim 1 in which the amount by which each current value of the frequency control digital word is altered to produce the subsequent value of the frequency control digital word after the synthesised output signal has transitioned for the first time from the one of the first and second states to the other of the first and second states is a proportion of the absolute value of the immediately previous amount by which the value of the frequency control digital word was altered.

7. A method as claimed in claim 1 in which the amount by which each current value of the frequency control digital word is altered to produce the subsequent value of the frequency control digital word after the synthesised output signal has transitioned for the first time from the one of the first and second states to the other of the first and second states is one half of the absolute value of the immediately previous amount by which the value of the frequency control digital word was altered.

8. A method as claimed in claim 1 in which the amount by which each current value of the frequency control digital word is altered to produce the subsequent value of the frequency control digital word until the synthesised output signal has transitioned for the first time from the one of the first and second states to the other of the first and second states is a function of the absolute value of the initial value of the frequency control digital word.

9. A method as claimed in claim 1 in which the amount by which each current value of the frequency control digital word is altered to produce the subsequent value of the frequency control digital word until the synthesised output signal has transitioned for the first time from the one of the first and second states to the other of the first and second states does not exceed half the absolute value of the initial value of the frequency control digital word.

10. A method as claimed in claim 1 in which the direct digital synthesiser is reset after each value of the frequency control digital word is applied thereto.

11. A method as claimed in claim 10 in which the direct digital synthesiser is reset in a constant phase relationship with the phase of the input signal.

12. A method as claimed in claim 10 in which the direct digital synthesiser is reset in phase with the phase of the input signal for producing the synthesised output signal phase locked with the phase of the input signal.

13. A method as claimed in claim 1 in which each subsequent value of the frequency control digital word is applied to the direct digital synthesiser for a duration corresponding to N periods of the input signal after the current value of the frequency control digital word was applied to the direct digital synthesiser, where N is a whole number from one upwards.

14. A method as claimed in claim 13 in which the value of N is selected to be equal to two.

15. A method as claimed in claim 1 in which the direct digital synthesiser is periodically reset after the value of the frequency control digital word which produces the synthesised output signal substantially in the phase relationship with the input signal has been applied to the direct digital synthesiser.

16. A method as claimed in claim 2 in which the state of the synthesised output signal is determined by monitoring a signal indicative of the phase of the synthesised output signal.

17. A method as claimed in claim 1 in which the signal indicative of the phase of the synthesised output signal is derived from a digital representation of the synthesised output signal.

18. A method as claimed in claim 16 in which the direct digital synthesiser comprises a modulo-M accumulator for producing digital words indicative of the phase of the synthesised output signal in response to each value of the frequency control digital word applied thereto, and the initial value of the frequency control digital word is a function of the value of the modulus M of the accumulator.

19. A method as claimed in claim 18 in which the initial value of the frequency control digital word is less than the value of the modulus M of the accumulator.

20. A method as claimed in claim 18 in which the signal indicative of the phase of the synthesised output signal is derived from an overflow signal from the accumulator.

21. A method as claimed in claim 18 in which the value of the frequency control digital word which produces the synthesised output signal in the phase relationship with the input signal is substantially equal to D times the product of the value of the modulus M of the accumulator multiplied by the quotient of the value of the period of a clock signal at which the accumulator is clocked divided by the value of the period of the input signal, where D is a whole number from one upwards, subject to the frequency of the synthesised output signal not exceeding half the frequency of the clock signal at which the accumulator is clocked.

22. A method as claimed in claim 21 in which the value of D is selected to be equal to one for producing the synthesised output signal of frequency substantially similar to the frequency of the input signal.

23. A method as claimed in claim 1 in which the synthesised output signal is representative of a sine wave.

24. A method as claimed in claim 1 in which the input signal is a repetitive pulse signal.

25. A digital waveform synthesiser for producing a synthesised output signal in a phase relationship with an externally generated input signal, the digital waveform synthesiser comprising:
a direct digital frequency synthesiser responsive to a frequency control digital word applied thereto for producing the synthesised output signal, an input terminal for receiving the externally generated input signal, a comparing circuit for comparing a signal indicative of the phase of the synthesised output signal with a signal indicative of the phase of the input signal, and a control circuit for applying an initial value of the frequency control digital word to the direct digital synthesiser, and being responsive to the comparing circuit for subsequently and sequentially applying progressively altered values of the frequency control digital word to the direct digital synthesiser until the synthesised output signal produced by the direct digital synthesiser is substantially in the phase relationship with the input signal, wherein the control circuit is adapted to derive each subsequent value of the frequency control digital word from the current value of the frequency control digital word by altering the current value of the frequency control digital word by an amount, the value of which is constant until the synthesised output signal has transitioned from one of a first state with the period of the synthesised output signal being greater than 1/H times the period of the input signal and a second state with the period of the synthesised output signal being less than 1/H times the period of the input signal to the other of the first and second states, where H is a whole number, and the control circuit is responsive to the synthesised output signal having transitioned from the one of the first and second states to the other of the first and second states for deriving each subsequent value of the frequency control digital word from the current value of the frequency control digital word by altering the current value of the frequency control digital word by an amount the value of which is less than the immediately previous absolute value of the amount by which the value of the frequency control digital word was altered.

26. A digital waveform synthesiser as claimed in claim 25 in which the control circuit is responsive to the comparing circuit determining that the synthesised output signal is in the first state for increasing the value of the frequency control digital word from the current value thereof, and the control circuit is responsive to the comparing circuit determining that the synthesised output signal is in the second state for decreasing the value of the frequency control digital word from the current value thereof.

27. A digital waveform synthesiser as claimed in claim 25 in which the value of H is selected to be equal to one.

28. A digital waveform synthesiser as claimed in claim 25 in which the comparing circuit is responsive to the signals indicative of the phases of the synthesised output signal and the input signal for producing a first signal indicative of the state of the synthesised output signal.

29. A digital waveform synthesiser as claimed in claim 28 in which the control circuit is responsive to the first signal produced by the comparing circuit being indicative of the synthesised output signal being in the first state for summing the amount by which the current value of the frequency control digital word is to be altered with the current value of the frequency control digital word in order to produce the subsequent value of the frequency control digital word.

30. A digital waveform synthesiser as claimed in claim 28 in which the control circuit is responsive to the first signal produced by the comparing circuit being indicative of the synthesised output signal being in the second state for subtracting the amount by which the current value of the frequency control digital word is to be altered from the current value of the frequency control digital word in order to produce the subsequent value of the frequency control digital word.

31. A digital waveform synthesiser as claimed in claim 25 in which the comparing circuit is responsive to the signals indicative of the phases of the synthesised output signal and the input signal for producing a second signal indicative of the synthesised output signal having transitioned for the first time from the one of the first state and the second states, to the other of the first and second states thereof.

32. A digital waveform synthesiser as claimed in claim 25 in which the amount by which each current value of the frequency control digital word is altered by the control circuit to produce the subsequent value of the frequency control digital word until the synthesis output signal has transitioned from the one of the first and second states to the other of the first and second states is a function of the absolute value of the initial value of the frequency control digital word.

33. A digital waveform synthesiser as claimed in claim 25 in which the direct digital synthesiser is reset after each value of the frequency control digital word is applied thereto.

34. A digital waveform synthesiser as claimed in claim 33 in which the direct digital synthesiser is reset in a constant phase relationship with the phase of the input signal.

35. A digital waveform synthesiser as claimed in claim 34 in which the direct digital synthesiser is reset in phase with the phase of the input signal.

36. A digital waveform synthesiser as claimed in claim 33 in which the direct digital synthesiser is reset at intervals corresponding to the duration of N periods of the input signal, where N is a whole number from one upwards.

37. A digital waveform synthesiser as claimed in claim 36 in which the value of N is selected to be equal to two.

38. A digital waveform synthesiser as claimed in claim 33 in which a reset signal for resetting the direct digital synthesiser is derived from the input signal.

39. A digital waveform synthesiser as claimed in claim 36 in which the control circuit is responsive to the input signal for applying the respective values of the frequency control digital word to the direct digital synthesiser at the intervals corresponding to the duration of the N periods of the input signal.

40. A digital waveform synthesiser as claimed in claim 25 in which the direct digital synthesiser comprises a modulo-M accumulator for producing digital words representative of the phase of the synthesised output signal.

41. A digital waveform synthesiser as claimed in claim 40 in which the direct digital synthesiser comprises a phase-to-magnitude converter for converting the digital words produced by the accumulator to a digital signal representative of the synthesised output signal.

42. A digital waveform synthesiser as claimed in claim 41 in which the signal indicative of the phase of the synthesised output signal is derived from the digital signal produced by the phase-to-magnitude converter.

43. A digital waveform synthesiser as claimed in claim 40 in which the signal indicative of the phase of the synthesised output signal is derived from an overflow signal from the accumulator.

44. A digital waveform synthesiser as claimed in claim 40 in which the initial value of the frequency control digital word is a function of the modulus M of the accumulator.

45. A digital waveform synthesiser as claimed in claim 25 in which the digital waveform synthesiser is implemented as a single chip integrated circuit on a single chip, the direct digital synthesiser, the control circuit and the comparing circuit being implemented as integrated circuits on the single chip.

46. A digital waveform synthesiser as claimed in claim 45 in which the digital waveform synthesiser comprises a single pin input terminal for receiving the input signal, and a single pin output terminal on which the synthesised output signal is produced.

47. A digital waveform synthesiser as claimed in claim 25 in which first and second communication ports are provided for facilitating writing of the initial value of the frequency control digital word and the initial value of the amount by which the initial value of the frequency control digital word is to be altered, respectively, to the control circuit.

48. A method as claimed in claim 25 in which the amount by which each current value of the frequency control digital word is altered by the control circuit to produce the subsequent value of the frequency control digital word after the synthesised output signal has transitioned for the first time from the one of the first and second states to the other of the first and second states is a proportion of the immediately previous absolute value of the amount by which the value of the frequency control digital word was altered.

49. A digital waveform synthesiser as claimed in claim 25 in which the amount by which each current value of the frequency control digital word is altered by the control circuit to produce the subsequent value of the frequency control digital word after the synthesised output signal has transitioned for the first time from the one of the first and second states to the other of the first and second states is one half of the immediately previous absolute value of the amount by which the value of the frequency control digital word was altered.

* * * * *